United States Patent
Wahl et al.

(10) Patent No.: US 10,026,674 B2
(45) Date of Patent: Jul. 17, 2018

(54) COOLING STRUCTURE FOR INTEGRATED CIRCUITS AND METHODS FOR FORMING SUCH STRUCTURE

(71) Applicant: Raytheon Company, Waltham, MA (US)

(72) Inventors: Joseph M. Wahl, Lexington, MA (US); Travis L. Mayberry, Dallas, TX (US); Gregory G. Beninati, Salem, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/978,358

(22) Filed: Dec. 22, 2015

(65) Prior Publication Data

US 2017/0178996 A1    Jun. 22, 2017

(51) Int. Cl.

| H01L 23/373 | (2006.01) |
| H01L 21/48 | (2006.01) |
| H01L 23/367 | (2006.01) |
| H01L 23/467 | (2006.01) |
| H01L 23/473 | (2006.01) |

(52) U.S. Cl.
CPC ........ *H01L 23/3732* (2013.01); *H01L 21/481* (2013.01); *H01L 23/3675* (2013.01); *H01L 23/3677* (2013.01); *H01L 23/467* (2013.01); *H01L 23/473* (2013.01)

(58) Field of Classification Search
CPC ......... H01L 23/34; H01L 23/36; H01L 23/40; H01L 31/0521
See application file for complete search history.

(56) References Cited

U.S. PATENT DOCUMENTS

| 8,537,554 | B1* | 9/2013 | Hockaday ........... H01L 31/0521 136/246 |
| 8,987,892 | B2 | 3/2015 | Davis et al. |
| 2011/0056669 | A1 | 3/2011 | Pruett et al. |

FOREIGN PATENT DOCUMENTS

WO    WO 2014/197999 A1    12/2014

OTHER PUBLICATIONS

Allen, S.; "Laser Chemical Vapor Deposition: A Technique for Selective Area Deposition;" Jul. 17, 1981, American Institute of Physics; 52(11); pp. 6501-6505 (5 pages).
Creamer, C.T, et al.; "Microchannel Cooled, High Power GaN-on-Diamond MMIC;" 2014; Microelectronics Center, BAE Systems; 978-4799-6441-3/14 IEEE; (5 pages).
Gray, K.J.; "Effective Thermal Conductivity of a Diamond Coated Heat Spreader;" Dec. 30, 1999; Diamond and Realted Materials, 9(2000); pp. 201-204 (4 pages).

\* cited by examiner

*Primary Examiner* — Jay C Chang
*Assistant Examiner* — Mikka Liu
(74) *Attorney, Agent, or Firm* — Daly, Crowley, Mofford & Durkee, LLP (57) ABSTRACT

A method for forming a cooling structure having a plurality of cooling members. The method includes: providing a template having a plurality of features, such members projecting outward from a base of a template or holes passing into the template, the features being arranged in a predetermined pattern, such pattern being selected in accordance with the predetermined pattern of cooling members; and forming a conformal coating of diamond over the features.

16 Claims, 13 Drawing Sheets

COOLING STRUCTURE FOR INTEGRATED CIRCUITS AND METHODS FOR FORMING SUCH STRUCTURE

TECHNICAL FIELD

This disclosure relates generally to channelized cooling structures for integrated circuits and more particularly to diamond channelized cooling structures.

BACKGROUND

As is known in the art, cooling structures used in many applications to transfer heat generated away from a heat source, such as from an integrated circuit. One such cooling structure is a channelized cooling structure wherein a cooling fluid, such as a gas or liquid is directed through the channels around the back side of an integrated circuit. One such arrangement is described in U.S. Pat. No. 8,987,892, issued Mar. 24, 2015, entitled "Method for creating a selective solder seal interface for an integrated circuit cooling system", inventors Davis et al., assigned to the same assignee as the present patent application. Another type of cooling structure includes a plurality of thermally conductive member having one end thermally coupled to the heat source and the opposite end connected to a heat sink. Both types of cooling structures are also sometime referred to as heat spreaders.

Because of its high thermal conductivity diamond cooling structures have been suggested. One such structure is described in a paper entitled "Microchannel Cooled, High Power GaN-on-Diamond MMIC" by T. Creamer, K. K. Chu, P. C. Chao, B. Schmanski, T. Yurovchak, S. Sweetland, Geoff Campbell and Henry Eppich, published in Lester Eastman Conference on High Performance Devices (LEC), 2014, 978-1-4799-6441-3/14 ©2014 IEEE. As described therein, methods for fabricating via holes and slots in, what appears to be a diamond block using approaches that include drilling and etching processes were being investigated. Thus, such approach would require the time consuming process of first forming a diamond block, and then removal of portions of the diamond; diamond being a relatively expensive material.

Another technique used to provide a diamond cooling structure is Volume 9, Issue 2, 1 Mar. 2000, Pages 201-204 Effective thermal conductivity of a diamond coated heat spreader by K. J Gray.

SUMMARY

In accordance with the present disclosure, a method is provided for forming a cooling structure having a plurality of cooling members. The method includes providing a template having a plurality of features, such as members projecting outward from a base of a template or holes passing into the template, the features being arranged in a predetermined pattern, such pattern being selected in accordance with the predetermined pattern of cooling members; and forming a conformal coating of diamond over the features.

In one embodiment, accordance with the present disclosure, a method is provided for forming a cooling structure having a predetermined pattern of cooling channels. The method includes: providing a template having a plurality of features, such as members projecting outward from a base of a template or holes passing into the template, the features being arranged in a predetermined pattern, such pattern being selected in accordance with the predetermined pattern of cooling channels; and forming a conformal coating of diamond over the features.

In one embodiment, the features have a height to width ratio in a range of 5 to 1 up to 19 to 1.

In one embodiment, the method includes: depositing a plurality of diamond structures in the predetermined pattern on a template; and removing the template to provide the diamond cooling structure.

In one embodiment, the method includes mounting an integrated circuit to the cooling structure.

In one embodiment, a method is provided for forming a cooling structure having a predetermined pattern of cooling channels. The method includes: forming a template having a predetermined pattern of features arranged in a predetermined pattern in accordance with the predetermined pattern of the cooling channels; forming a continuous coating of a thermally conductive material over the predetermined pattern of features; and providing the cooling structure comprising selectively removing the portion of the template from the thermally conductive material.

In one embodiment, the features comprise a plurality of members extending outwardly from a surface of the template.

In one embodiment, the features comprise a plurality of holes passing through the template.

In one embodiment, the plurality of holes pass through upper and lower surfaces the template and wherein the features comprise a slot projecting inward from a sidewall of the template in a region between a pair of sets of the holes.

In one embodiment, a method is provided for forming a cooling structure having a predetermined pattern of cooling channels and a manifold having an input port for receiving a coolant and directing the received coolant to the cooling channels and an output port for removing the coolant after such coolant has passed through the cooling channels. The method includes: forming a template having a predetermined pattern of features arranged in a predetermined pattern in accordance with the predetermined pattern of the cooling channels and the manifold; forming a continuous coating of a thermally conductive material over the template including the feature; and providing the cooling structure comprising removing the template from the thermally conductive material.

In one embodiment, the features comprise a plurality of holes passing through the template.

In one embodiment, the plurality of holes pass through upper and lower surfaces the template and wherein the features comprise a slot projecting inward from a sidewall of the template in a region between a pair of sets of the holes.

In one embodiment a diamond structure is provided, comprising: a predetermined pattern of diamond features arranged to provide a pattern of cooling channels; and a diamond manifold having an input port for receiving a coolant and directing the received coolant to the cooling channels and an output port for removing the coolant after such coolant has passed through the cooling channels.

Thus, rather than using a diamond removal, or subtractive process, that is time consuming, expensive, and wasteful, the disclosure uses a diamond additive process whereby diamond is grown only in selected, predetermined areas in a predetermined geometry.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
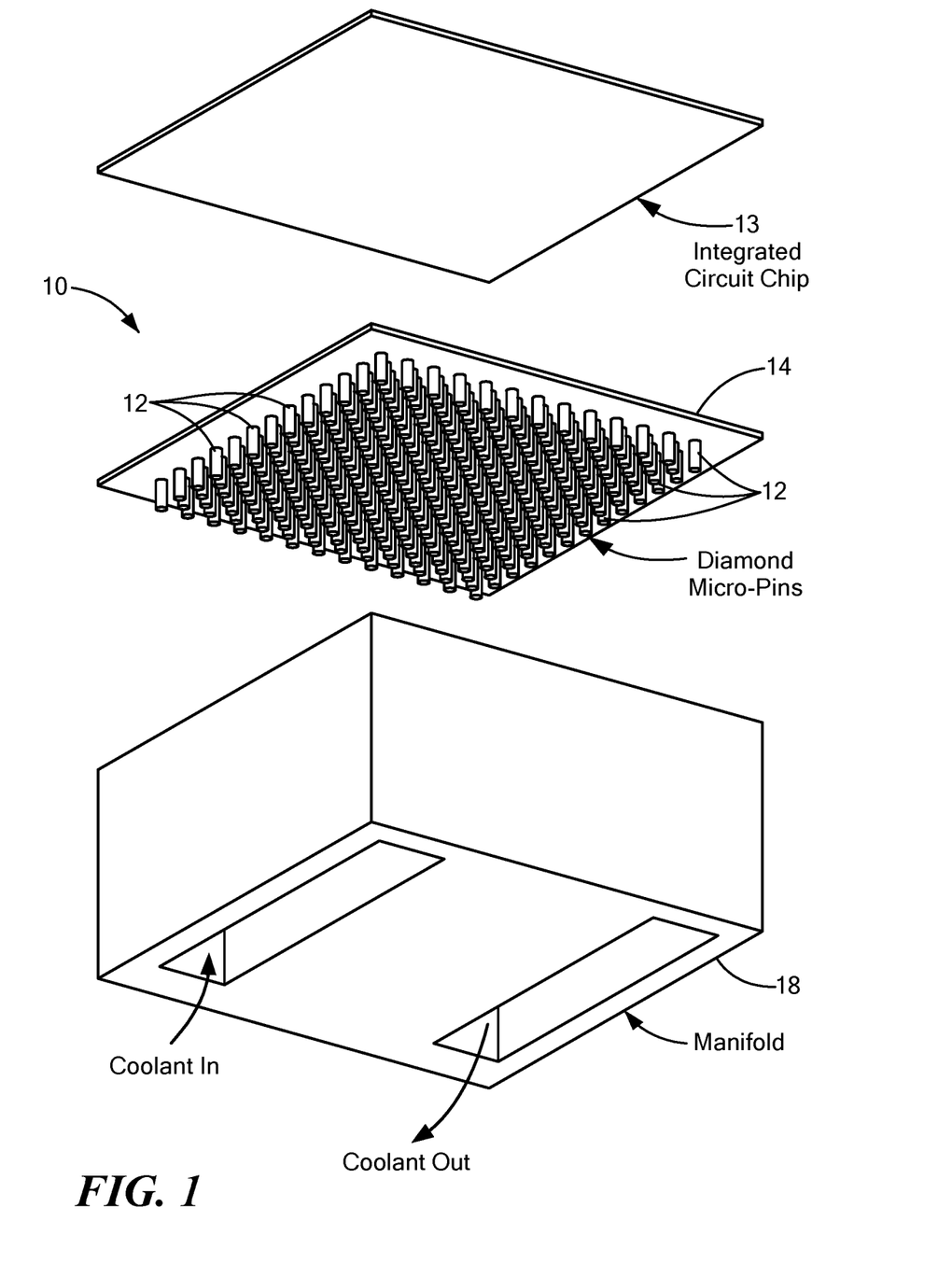
FIG. 1 is an exploded, isometric view of an integrated circuit, a cooling structure and a cooling manifold arranged to provide a system for cooling the integrated circuit according to the disclosure.
Figure 2:
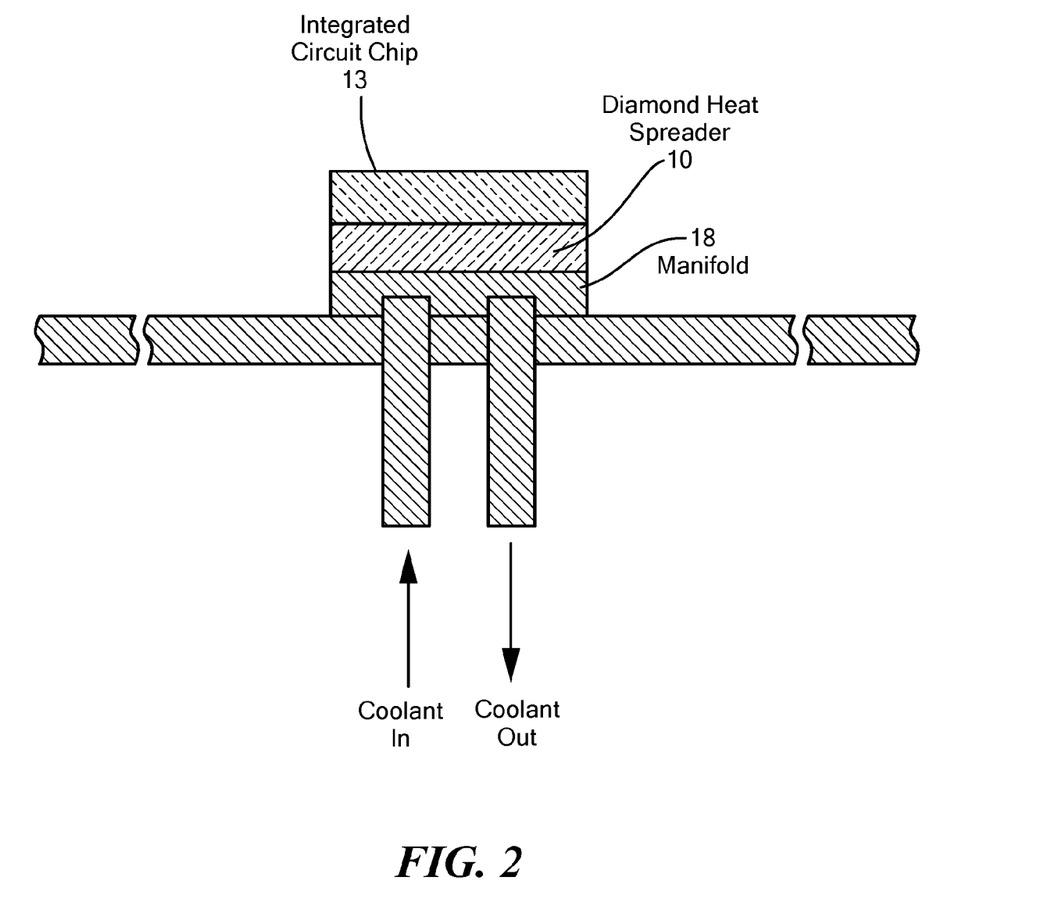
FIG. 2 is a cross section, assembled view of the system of FIG. 1.

Referring now to FIG. 1, a cooling structure, or heat spreader, 10 is shown having a plurality of diamond coated features 12; here for example, columnar support members 12, here a plurality of pins or rods, projecting outwardly from a front side of a diamond base 14. The method for forming the diamond coated features 12 will be described in more detail in connection with FIGS. 3A-3C and 4A-4E. Suffice it to say here that an integrated circuit chip 13 is mounted to a back side of the base 14. The plurality of diamond coated features 12 is arranged in a predetermined pattern to provide cooling channels for directing a cooling fluid, such as air or a liquid, introduced into the channels by a manifold 18 mounted to the front side of the base 14 of the cooling structure 10, as shown FIGS. 1 and 2. The plurality of diamond coated features 12 is arranged in a predetermined pattern to provide sufficient numbers, surface area, and volume to efficiently transfer the heat generated by the integrated circuit chip 13, as shown in FIGS. 1 and 2, to the cooling fluid.

Figure 3A:
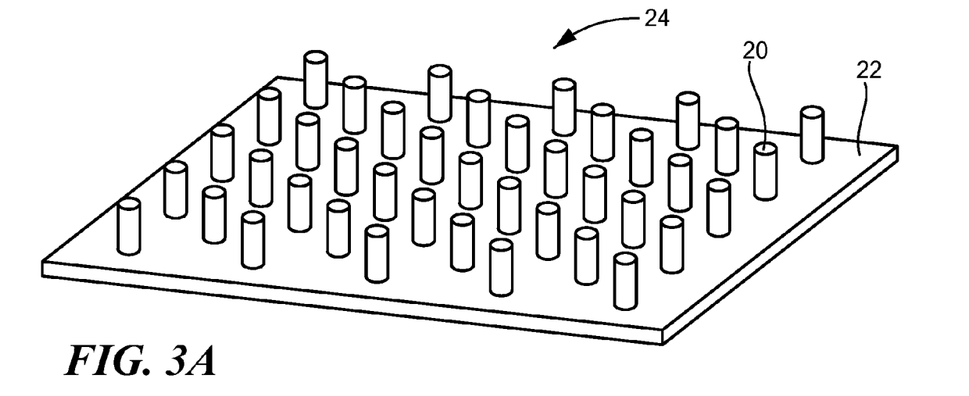
FIGS. 3A-3C is a series of isometric views showing fabrication of the cooling structure of FIG. 1 at various stages in the fabrication thereof in accordance with the disclosure.
Figure 3B:
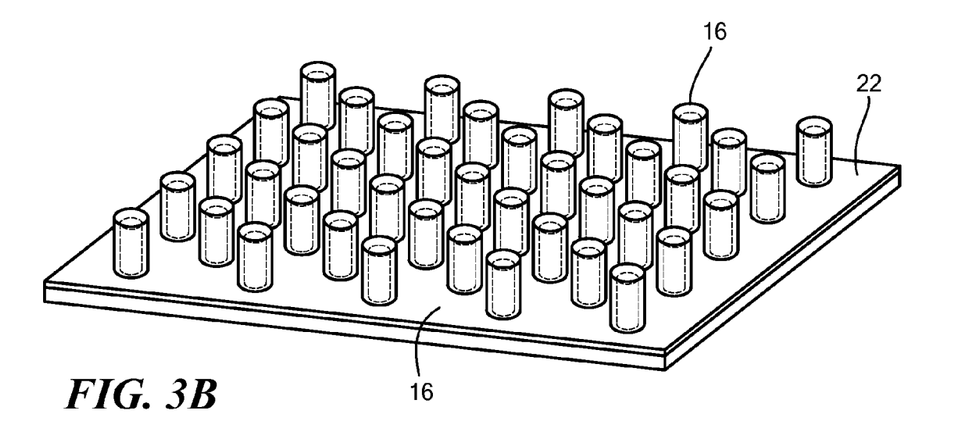
Figure 3C:
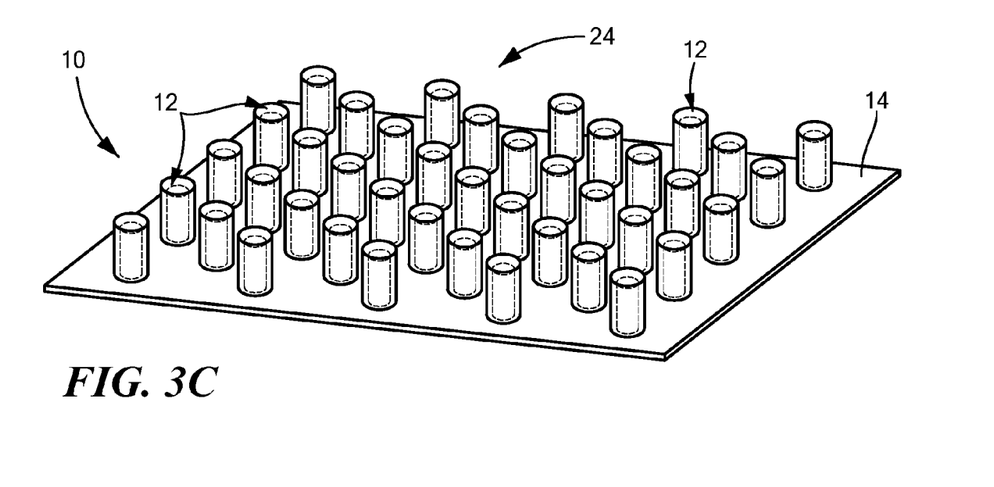

Referring to FIGS. 3A-3C, the process is summarized. First, a Laser Induced Chemical Vapor Deposition (LCVD) process is used to print very precise (micron-resolution), high aspect ratio features, here vertically extending members or rods 20 outwardly from a silicon substrate 22 as shown in FIG. 3A, (for example, length (L) to diameter (D) aspect ratios (L/D) in a range of 5 to 1 up to 19 to 1, it being understood that higher (L/D) ratios are possible and will improve thermal performance). One range for example, may be diameters of 19 microns with length varying from 100 to 350 microns with diameters decreasing to approximately 5 microns which would increase the L/D ratios. Here the rods 20 are, for example, Silicon Carbide (SiC). The substrate 22 can contain other high aspect ratio features in place of rods, such as pin fins, elliptical fins, conical fins, or any other desired feature such as elliptical shaped rods instead of cylindrical shaped rods; having minimum (L/D) aspect ratios of 5 to 1. The silicon substrate 22 with the silicon carbide rods 20 provide a template 24 having here for example an overall length to width dimension of, for example, in the order of 1 cm by 1 cm.

Next, as shown in FIG. 3B, a Microwave Plasma Chemical Deposition (MCVD) process is used to grow a continuous layer 16 of diamond around the rods 20 and over the exposed portions of the substrate 22, that is, the regions of the substrate 22 between the rods 20; here for example, the diamond is conformal coated over the substrate to a thickness of between 10 and 100 microns, more typically 30 microns. It should be understood that other methods may be used such as, for example, Hot Filament Deposition. Next, as shown in FIG. 3C, the template 24 (the silicon substrate 22 with the silicon carbide rods 20) is removed here, for example, by placing the entire structure (the shown template 24 (the silicon substrate 22 with the silicon carbide rods 20) with the layer 16 of diamond) in a chemical bath of any conventional silicon etchant, for example, Nitric acid, Glacial Acetic acid, and Hydrofluoric acid, to etch away the silicon substrate 22 portion of the template 24 using a timed etch process thereby forming the cooling structure 10 (shown in FIG. 3C).

Figure 4A:
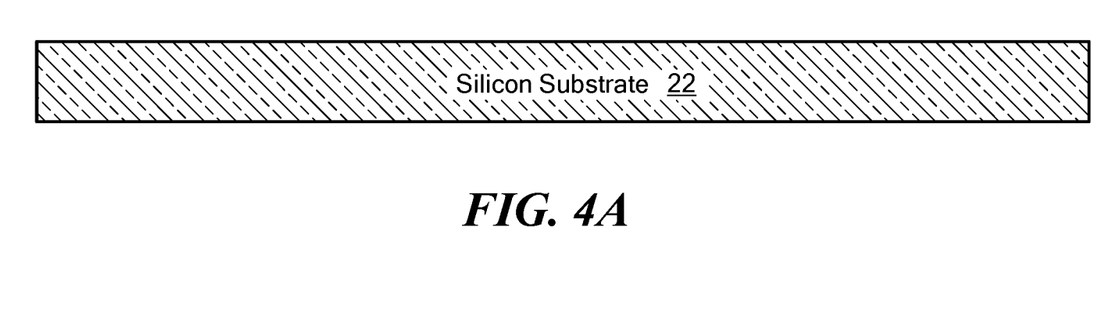
FIGS. 4A-4E is a series of cross sectional views showing in more detail the fabrication of the cooling structure of FIG. 1 at various stages in the fabrication thereof in accordance with the disclosure.
Figure 4B:
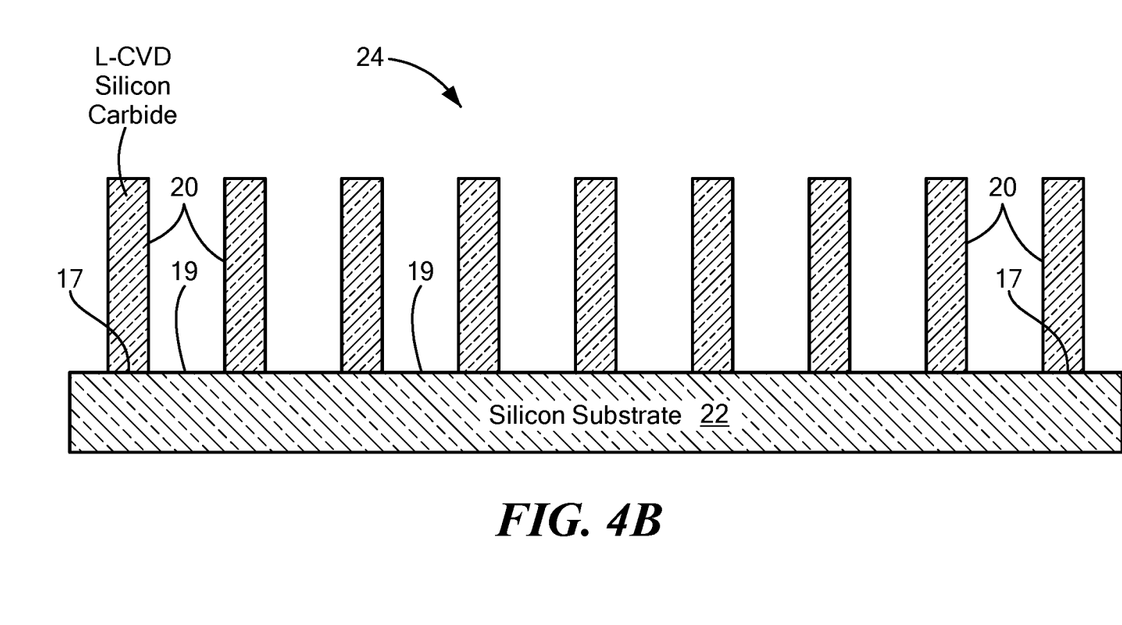

Referring now to FIGS. 4A-4E, the process is described in more detail. Thus, first, the template 24 (FIG. 4B) is formed by first providing the silicon substrate 22 (FIG. 4A). Next, as shown in FIG. 4B, the silicon carbide (SiC) pin features, members 20 are grown additively on the Silicon (Si) substrate 22 using any conventional Laser Induced CVD (LCVD) process to print very precise (micron-resolution) and high aspect ratio SiC features on the Si substrate, thus, completing the formation of the template 24.

It is noted that the template 24 has a predetermined pattern of template members, here rods 20, projecting outwardly from first surface portions 17 (FIG. 4C) of the silicon substrate 22 portion of the template 24 with second surface portions 19 of the silicon substrate 22 portion of the template 24 being disposed between the rods 20. It is noted that the template members 20 are arranged in a predetermined pattern in accordance with the predetermined pattern of cooling channels to be formed between the rods 20. This is a relatively rapid deposition process (~100 microns per second) and deposits many rods 20 simultaneously.

Figure 4C:
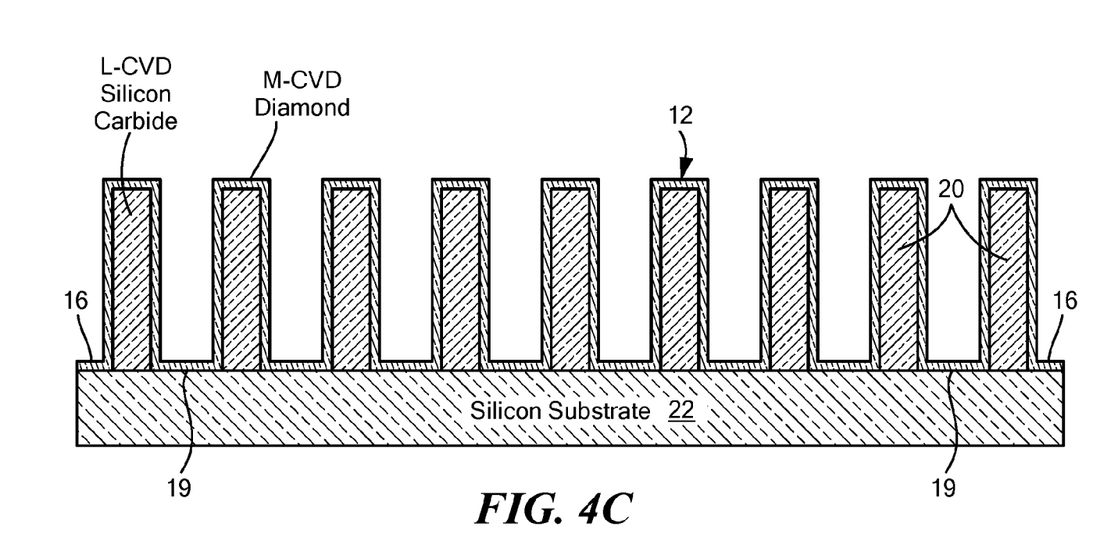

Next, referring to FIG. 4C, a continuous coating or layer 16 of a thermally conductive material, here diamond, is formed over the second surface portion 19 of the silicon substrate 22 portion of the template 24 and over the outwardly projecting rods 20. As will be described, the thermally conductive material 16 over the second portions 19 of the silicon substrate 22 portion of the template 24 will provide a thermally conductive base 14 (FIG. 1) for the cooling structure 10 (FIG. 1). More particularly, the template 24 is placed in a microwave diamond deposition reactor apparatus, not shown, which deposits a continuous conformal layer 16 of diamond over the Si substrate 22 and over the SiC rods 20, coating both the rods 20 and the exposed surface portions 19 of the silicon substrate 22 portion of the template 24 in one processing step thereby producing the diamond coated features 12. By doing this diamond coating 16 is deposited in only the thickness needed for the application. In total, the LCVD and MCVD process takes less than 1 week. Diamond is deposited at about 1-4 microns an hour and hence this process is completely tailorable while at the same time weeks shorter than the traditional slab deposition and grinding, laser ablation, or Deep Reactive Ion Etching methods.

Figure 4D:
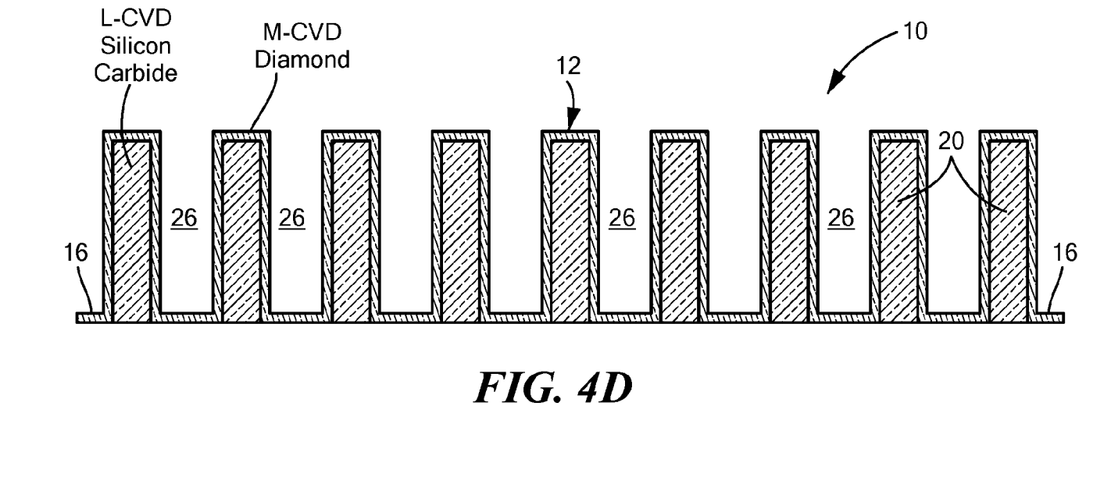

Next, the silicon substrate 22 portion of the template 24 is removed by here placing the entire structure shown in FIG. 4C in a chemical bath of any conventional silicon etchant, for example, Nitric acid, Glacial Acetic acid, and Hydrofluoric acid, to etch away the silicon substrate 22 using a timed etch process thereby forming the cooling structure 10 forming the heat spreader, 10 shown in FIG. 4D. It is noted that the silicon substrate may be retained.

Figure 4E:
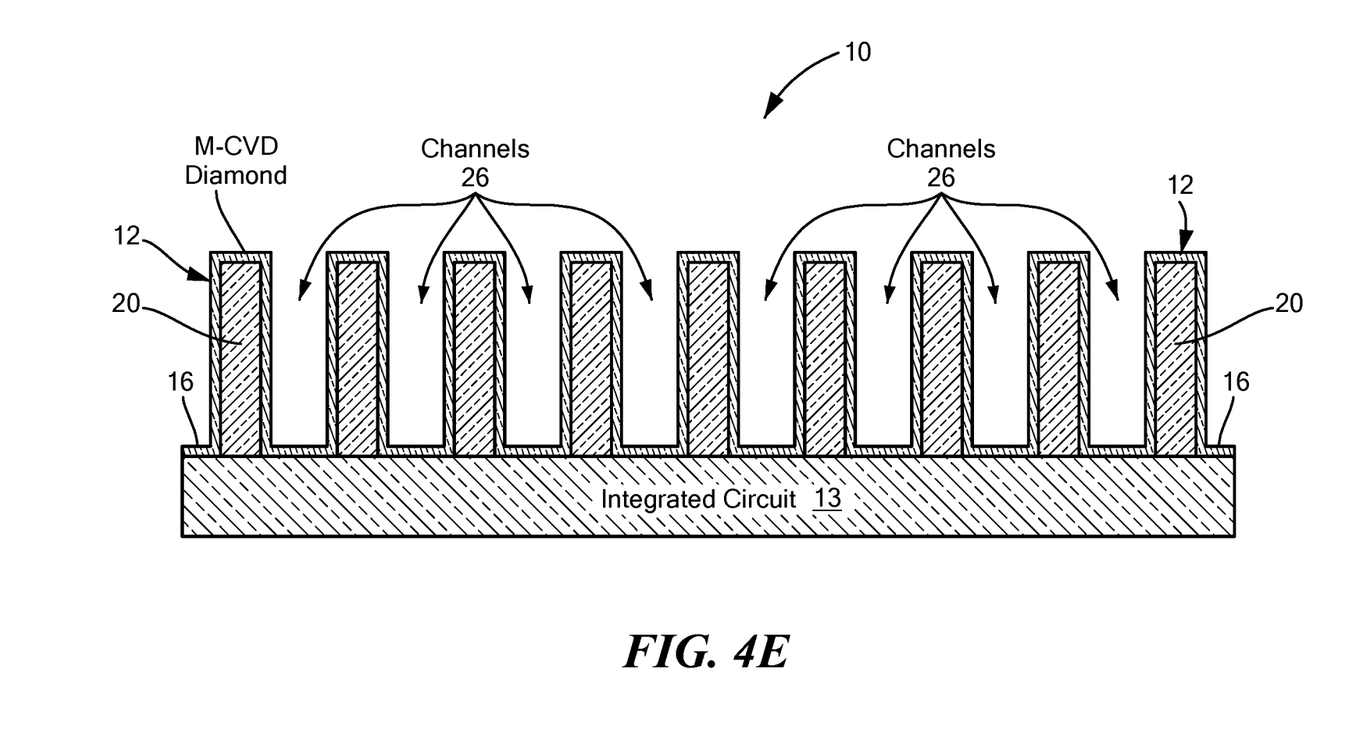

Next, the integrated circuit 13 is mounted to the back side of the cooling structure 10, as shown in FIG. 4E (or to the silicon substrate 22 if it is retained) using any convenient bonding technique such as by solder attachment. It is noted that the regions 26 between the diamond coated features 12 provide the cooling channels.

Figure 5A:
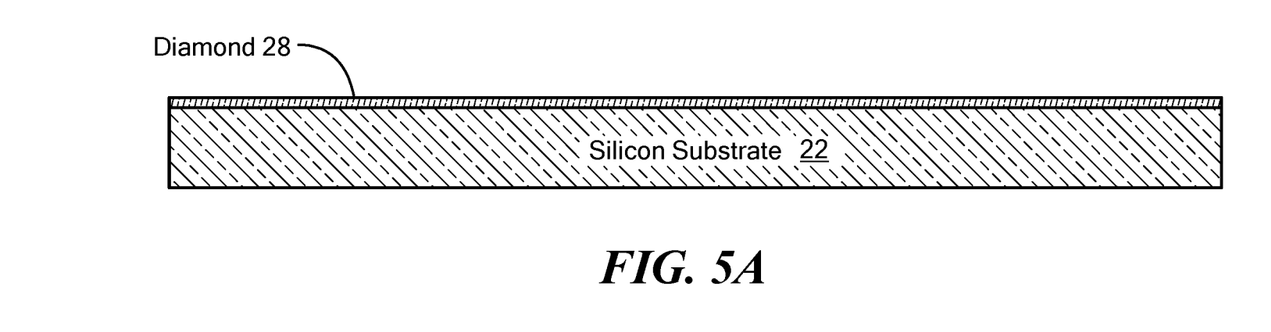
FIGS. 5A-5E is a series of cross sectional views showing fabrication of the cooling structure of FIG. 1 at various stages in the fabrication thereof in accordance with another embodiment of the disclosure.
Figure 5B:
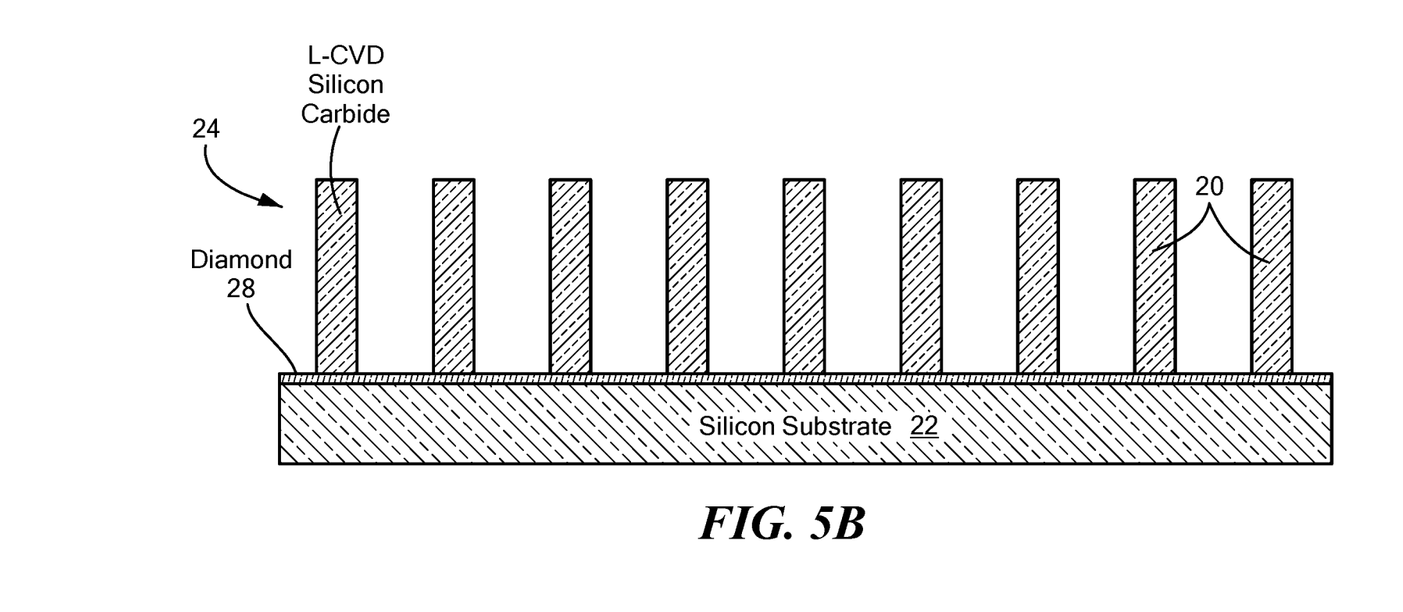
Figure 5C:
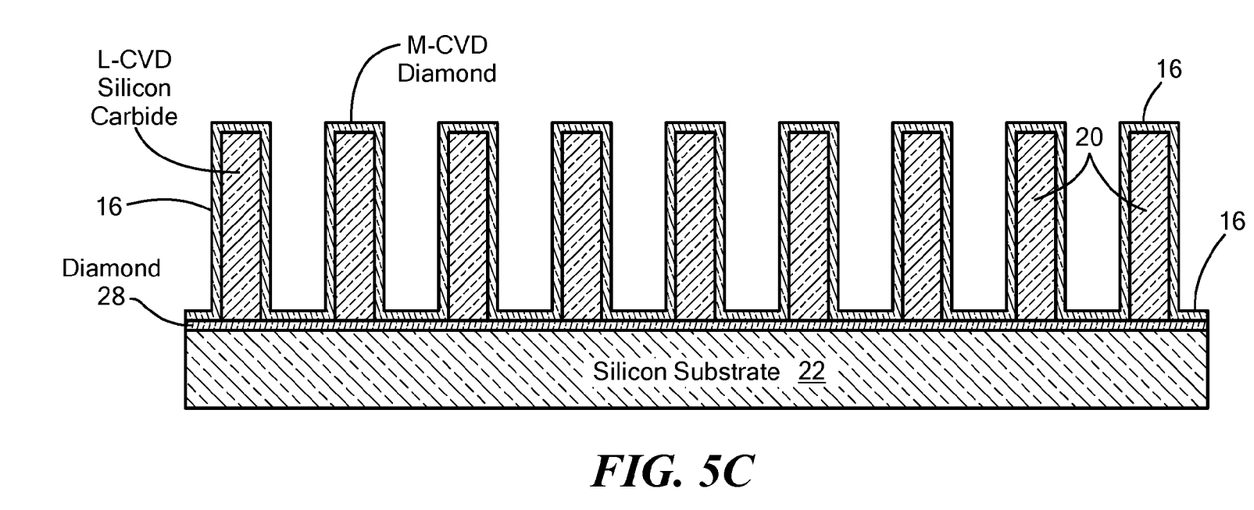
Figure 5D:
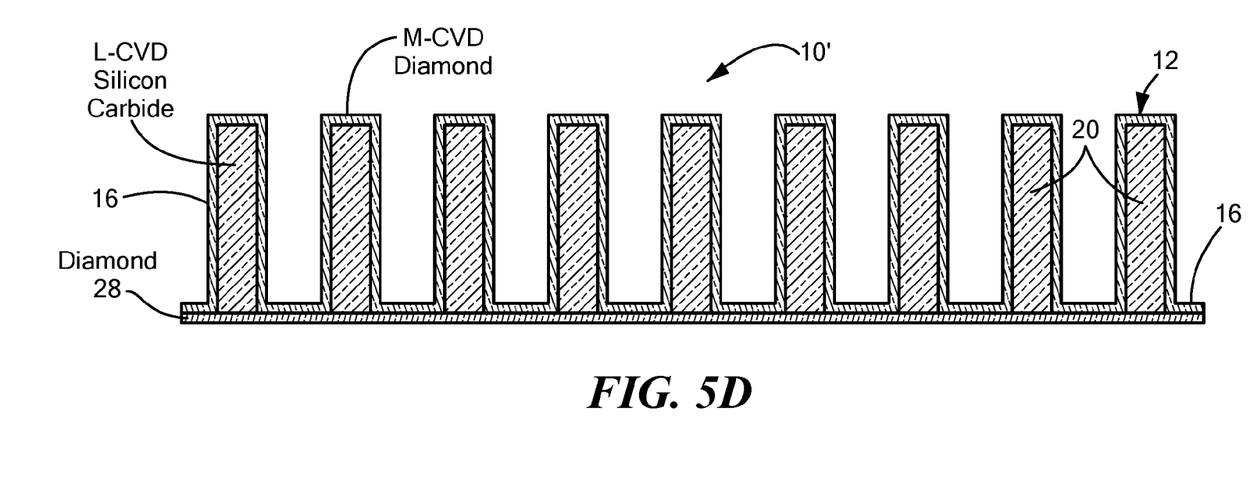
Figure 5E:
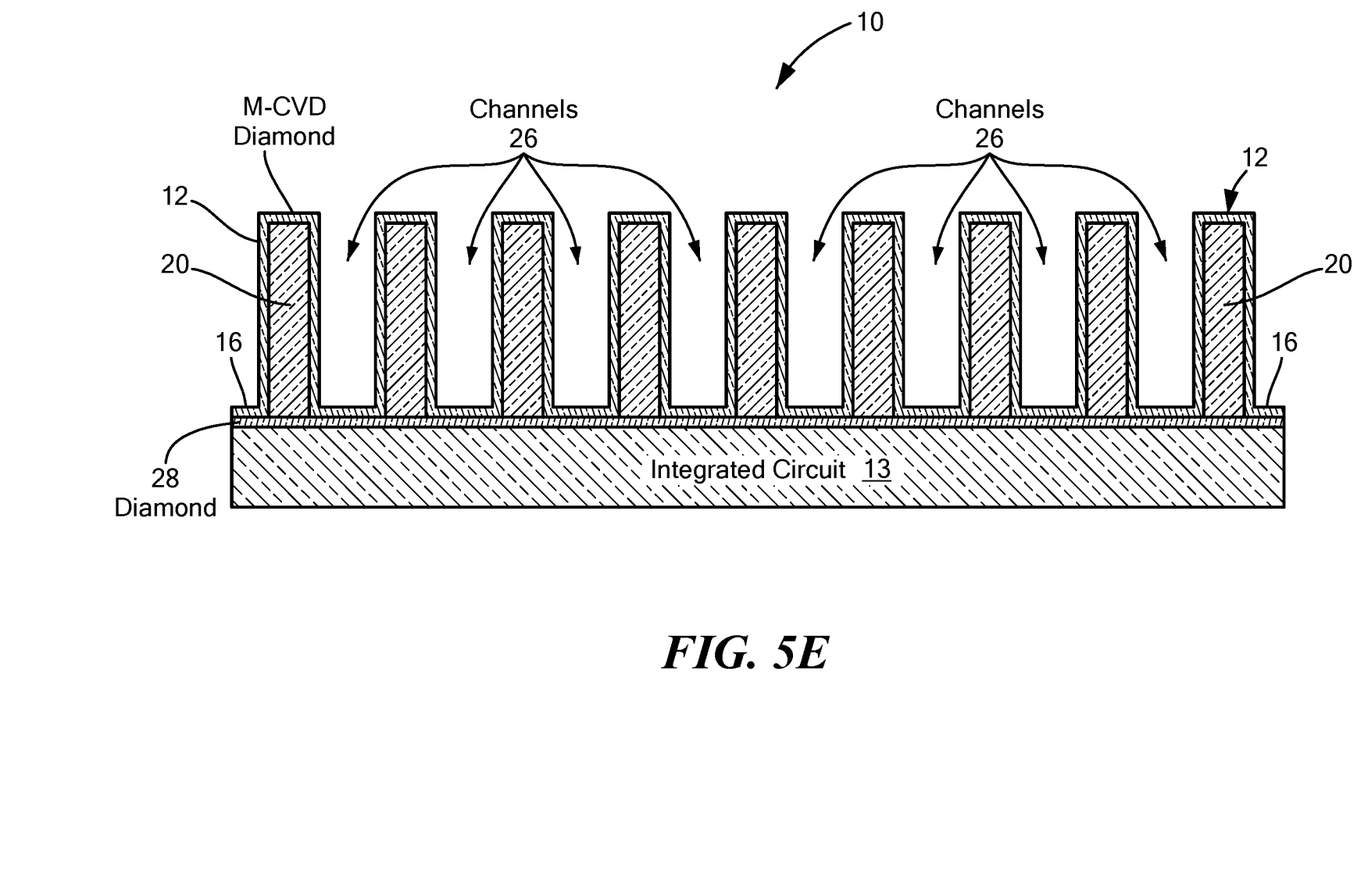

Referring now to FIGS. 5A-5E, an alternative embodiment is shown. Here a thickening layer 28 of diamond, here having a thickness in the range of 50 to 500 microns thick, most typically 100 to 200 microns, for example, is deposited on the surface of the substrate 22, here for example silicon, prior to forming the rods 20, as shown in FIG. 5A. It should be noted that rather than using a substrate 28, a separate substrate need not be used but rather, the layer 28 may be formed as a diamond wafer having a thickness of 100 to 200 microns and then forming the LCVD SiC rods on the diamond wafer as shown in FIG. 5B. The process continues as described in connection with FIGS. 4A-4D, with the silicon substrate 22 being removed as shown in FIG. 5D, if such a substrate is used rather than the diamond wafer described above, after which, in either case, a layer 16 of diamond is deposited as shown in FIG. 5C. Here however, as shown in FIG. 5D, the thickening layer 28 increases the effective thickness, and hence structural integrity of the cooling structure 10'. The integrated circuit chip 13 is then mounted as shown in FIG. 5E with the cooling channels 26 being formed between the diamond coated features 12.

Figure 6A:
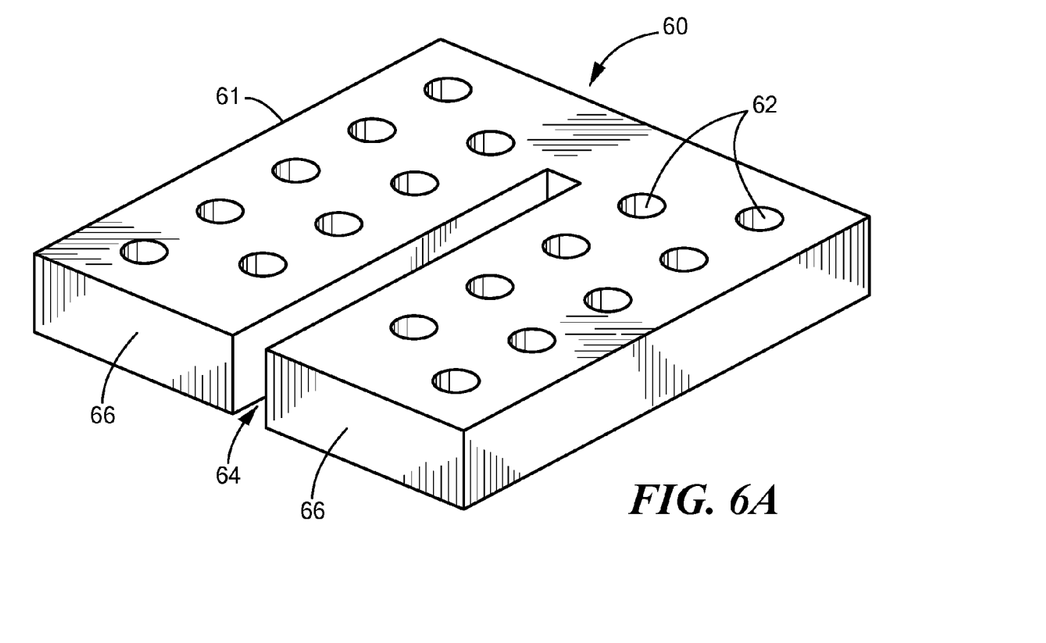
FIGS. 6A-6E is a series of perspective views showing fabrication of the cooling structure at various stages in the fabrication thereof in accordance with another embodiment of the disclosure.
Figure 6B:
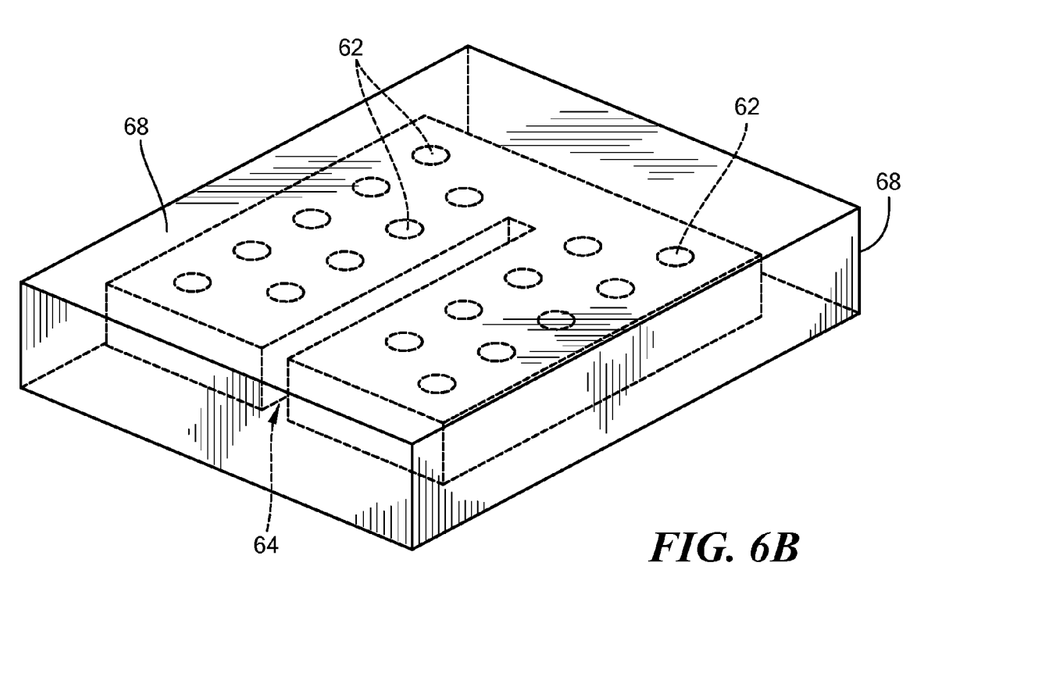
Figure 6C:
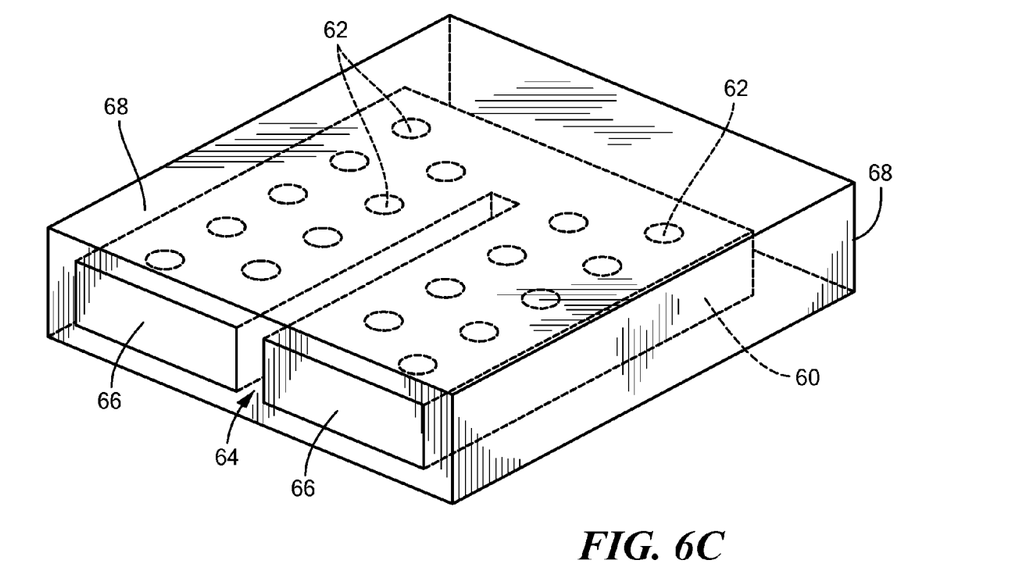
Figure 6D:
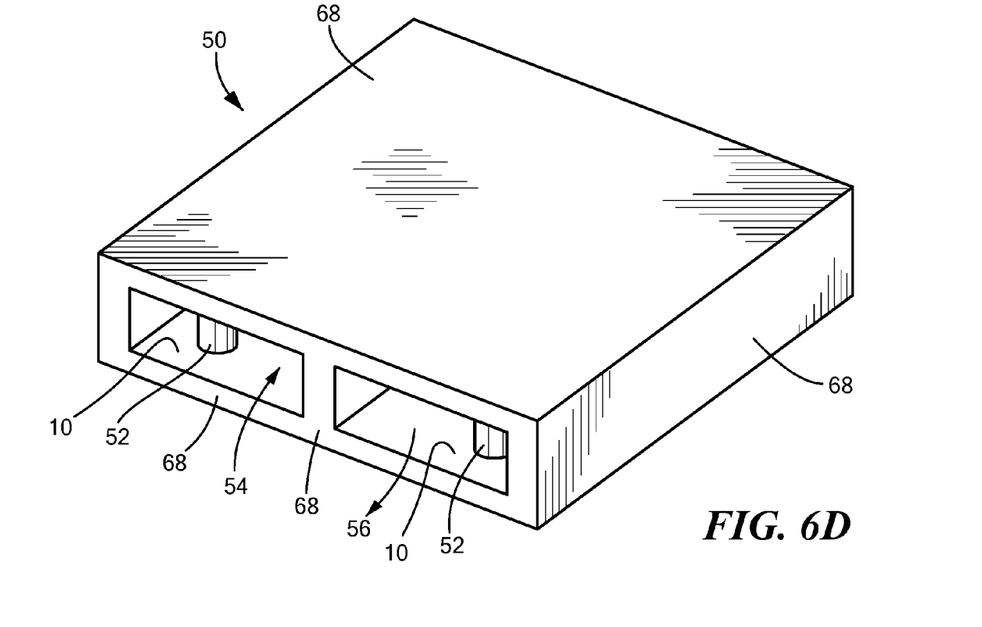
Figure 6E:
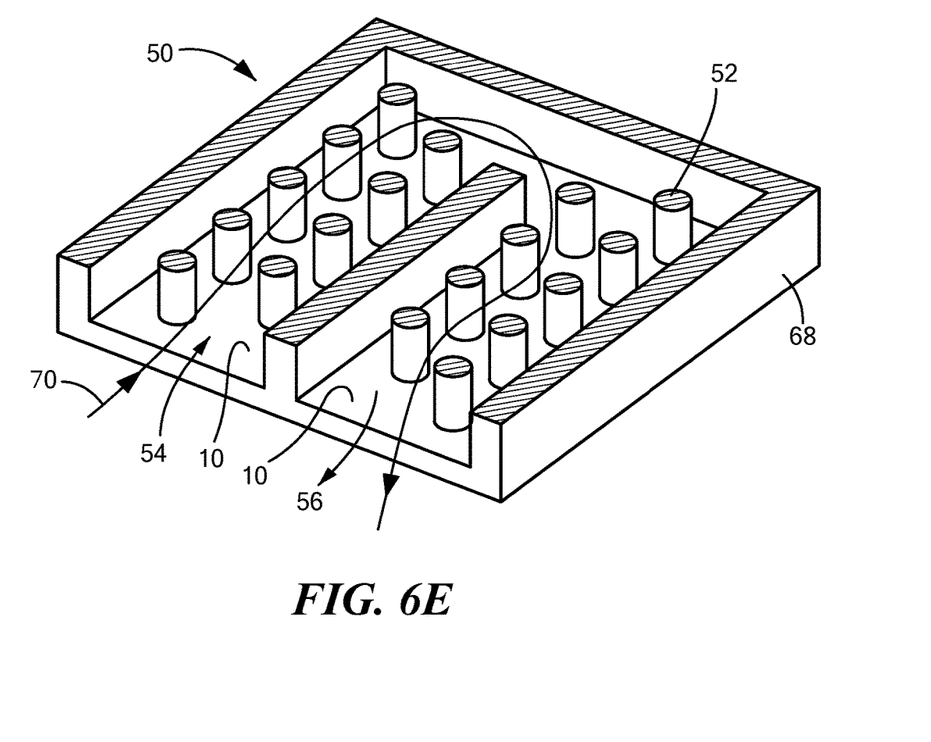

Referring now to FIGS. 6A-6G, an alternative cooling structure 50 is shown in FIG. 6E, such structure 50 being a monolithic structure having both cooling channels 54 provided by diamond pins 52 and an integrally formed manifold 68 having a coolant input port 54 and a coolant output port 56.

Referring first to FIG. 6A, a template 60, here for example, a block 61 of silicon, having features (here an array of holes 62) passing vertically through template 60 separated by a slot 64 projecting inwardly from one side 66 of the template 60) arranged in a predetermined pattern selected in accordance with a pattern of the cooling channels and the coolant inlet port 54 (FIG. 6E) of the cooling manifold, for passing a fluid into the channels, then to the output port 56 of the cooling manifold, for removing the coolant from the cooling channels.

Next, referring to FIG. 6B, a layer of thermally conductive material 68, here for example diamond having a thickness in the range of 50 to 500 microns, more typically 100 to 200 microns, is deposited over all six sides of the template 60 including over walls of the features 62, 64.

Figure 6F:
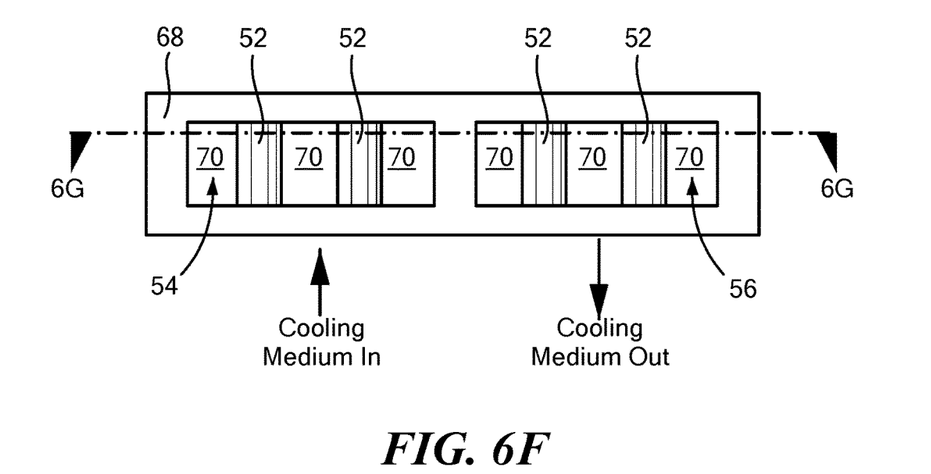
FIG. 6F is a frontal view of the cooling structure fabricated fabrication stages of FIGS. 6A-6E.
Figure 6G:
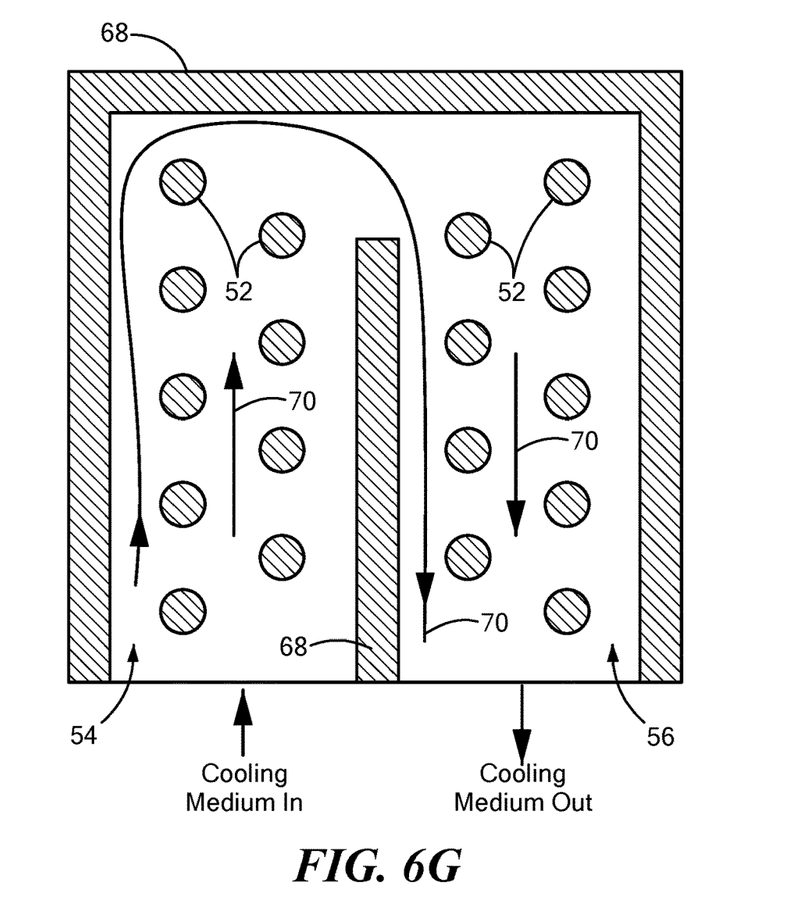
FIG. 6G is a cross sectional view of the cooling structure of FIG. 6F, such cross section being taken along lines 6G-6G of FIG. 6F.

Next, referring to FIG. 6C, the thermally conductive layer 68 is removed from the side 66 of the template 60 having the slot 64 to expose the underlying portions of the template 60. It should be understood that an alternative step would be to not coat the side 66 with the thermally conductive material. Next, the exposed portions of the template 60 are etched with a suitable silicon etchant for example, Nitric acid, Glacial Acetic acid, and Hydrofluoric acid, for a predetermined period of time to completely remove the silicon template 60 leaving the remaining portion of the thermally conductive layer, as shown in FIGS. 6D and 6E, thereby forming a monolithic structure having both a heat spreader 10 (FIG. 6E) with cooling channels 70 formed by spaces between the pins 52 and an integrally formed manifold having the coolant input port 54 and the coolant output port 56. FIG. 6F is a frontal view of the cooling structure 50 and FIG. 6G is a cross sectional view of the cooling structure of FIG. 6F, such cross section being taken along lines 6G-6G of FIG. 6F. It should be understood that while here the input port and output port are on the same side, the input port and the output port may be on opposite sides or adjacent sides. Further, other geometrical configurations can be used such as, for example, triangular or circular or other.

A number of embodiments of the disclosure have been described. Nevertheless, it will be understood that various modifications may be made without departing from the spirit and scope of the disclosure. For example, while diamond coated rod like structures have been described to provide a pattern of channels, a linear array of diamond channels, as shown in FIG. 6, may be formed using the process described above where the projecting template members would be a linear array of parallel wall-like members. Further, alternate materials for substrate wafers and LCVD features include, but are not necessarily limited to Si (Silicon), SiC (Silicon Carbide), Diamond, Mo (Molybdenum). Accordingly, other embodiments are within the scope of the following claims.

What is claimed is:

1. A method for forming a cooling structure having a predetermined pattern of cooling channels, comprising:
   forming a template having a predetermined pattern of features arranged in a predetermined pattern in accordance with the predetermined pattern of the cooling channels;
   forming a continuous coating of a thermally conductive material over the predetermined pattern of features; and
   providing the cooling structure comprising selectively removing at least a portion of the template from the thermally conductive material.

2. The method recited in claim 1 wherein the features comprise a plurality of members extending outwardly from a surface of the template.

3. The method recited in claim 1 wherein the features comprise a plurality of holes passing through the template.

4. The method recited in claim 3 wherein the plurality of holes pass through upper and lower surfaces of the template and wherein the features comprise a slot projecting inward from a sidewall of the template in a region between a pair of sets of the holes.

5. The method recited in claim 1 wherein the thermally conductive material is diamond.

6. A method for forming a cooling structure having a predetermined pattern of cooling channels and a manifold having an input port for receiving a coolant and directing the received coolant to the cooling channels and an output port for removing the coolant after such coolant has passed through the cooling channels, comprising:
   forming a template having a predetermined pattern of features arranged in a predetermined pattern in accordance with the predetermined pattern of the cooling channels and the manifold;
   forming a continuous coating of a thermally conductive material over the template including the predetermined pattern of features; and
   providing the cooling structure comprising removing the template from the thermally conductive material.

7. The method recited in claim 6 wherein the features comprise a plurality of holes passing through the template.

8. The method recited in claim 7 wherein the plurality of holes pass through upper and lower surfaces of the template and wherein the features comprise a slot projecting inward from a sidewall of the template in a region between a pair of sets of the holes.

9. The method recited in claim 6 wherein the thermally conductive material is diamond.

10. A method for forming a cooling structure having a predetermined pattern of cooling channels, comprising:
    forming a template having a predetermined pattern of template members projecting outwardly from first portions of the template, the template members being arranged in a predetermined pattern in accordance with the predetermined pattern of the cooling channels, second portions of the template being disposed between the first portions of the template; and
    forming a continuous coating of a thermally conductive material over the outwardly projecting template members, and over the second portion of the template, the second portions of the template providing a thermally conductive base for the cooling structure; and
    providing the cooling structure comprising selectively removing the second portions of the template from the thermally conductive material.

11. The method recited in claim 10 wherein the template comprises a substrate, and the method includes forming a thickening layer of the thermally conductive material over the substrate prior to forming the predetermined pattern of template members projecting outwardly from the first portions of the template.

12. A method for cooling an integrated circuit, comprising:
    (A) forming a cooling structure a predetermined pattern of cooling channels for directing a cooling fluid through the cooling channels and over a back surface of the integrated circuit, comprising:
        forming a template having a predetermined pattern of features arranged in a predetermined pattern in accordance with the predetermined pattern of the cooling channels;
        forming a continuous coating of a thermally conductive material over the predetermined pattern of features; and;
        providing the cooling structure comprising selectively removing portions of the template from the thermally conductive material; and
    (B) mounting the integrated circuit to the provided cooling structure.

13. The method recited in claim 12 wherein the features comprise a plurality of members extending outwardly from a surface of the template.

14. The method recited in claim 12 wherein the features comprise a plurality of holes passing through the template.

15. The method recited in claim 14 wherein the plurality of holes pass through upper and lower surfaces of the template and wherein the features comprise a slot projecting inward from a sidewall of the template in a region between a pair of sets of the holes.

16. A diamond structure, comprising:
    a predetermined pattern diamond features arranged to provide a pattern of cooling channels; and
    a diamond manifold having an input port for receiving a coolant and directing the received coolant to the cooling channels and an output port for removing the coolant after such coolant has passed through the cooling channels.

\* \* \* \* \*